United States Patent
Lee et al.

(10) Patent No.: US 9,236,587 B2
(45) Date of Patent: Jan. 12, 2016

(54) BATTERY MODULE AND BATTERY PACK EMPLOYED WITH THE SAME

(71) Applicant: LG CHEM, LTD., Seoul (KR)

(72) Inventors: BumHyun Lee, Seoul (KR); Jong Moon Yoon, Daejeon (KR); Yong Shik Shin, Daejeon (KR); Jin Kyu Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 92 days.

(21) Appl. No.: 13/759,088

(22) Filed: Feb. 5, 2013

(65) Prior Publication Data

US 2013/0149577 A1 Jun. 13, 2013

Related U.S. Application Data

(63) Continuation of application No. PCT/KR2011/005819, filed on Aug. 10, 2011.

(30) Foreign Application Priority Data

Aug. 16, 2010 (KR) .................. 10-2010-0078624

(51) Int. Cl.
 *H01M 2/10* (2006.01)
 *G01R 31/36* (2006.01)
 (Continued)

(52) U.S. Cl.
 CPC ......... *H01M 2/1016* (2013.01); *B60L 11/1879* (2013.01); *G01R 31/36* (2013.01);
 (Continued)

(58) Field of Classification Search
 CPC ..... H01M 2/1016; H01M 2/206; H01M 2/22; H01M 2/0245; H01M 2/1077; H01M 2/1083; H01M 10/0413; H01M 10/0463; H01M 10/4207; H01M 10/425; H01M 10/48; H01M 10/482; H01M 2200/20; Y02T 10/7005; Y02T 10/705; Y02T 90/16; G01R 31/36; G01R 31/3696; G01R 31/3606
 See application file for complete search history.

(56) References Cited

U.S. PATENT DOCUMENTS

| 5,756,227 A * | 5/1998 | Suzuki et al. .................. 429/62 |
| 2005/0123828 A1 * | 6/2005 | Oogami et al. ............... 429/152 |

(Continued)

FOREIGN PATENT DOCUMENTS

| CN | 1677711 A | 10/2005 |
| JP | 2004-31122 A | 1/2004 |

(Continued)

OTHER PUBLICATIONS

Federal Register, vol. 76, No. 27 issued Feb. 9, 2011 which details Supplementary Examination Guidelines for Determining Compliance with 35 U.S.C. 112 and for Treatment of Related Issues in Patent Applications, pp. 7162-7175.*

(Continued)

*Primary Examiner* — Ula C Ruddock
*Assistant Examiner* — Amanda Barrow
(74) *Attorney, Agent, or Firm* — Birch, Stewart, Kolasch & Birch, LLP

(57) ABSTRACT

Disclosed is a battery module having a plurality of battery cells, the battery module including a cell module stack having a structure in which a plurality of cell modules having the battery cells mounted in cartridges is vertically stacked, a lower end plate supporting a lower end of the cell module stack, and an upper end plate fixing an uppermost cartridge of the cell module stack disposed on the lower end plate, wherein the cartridges and the upper and lower end plates are provided with through holes formed such that the through holes communicate with one another, a fixing member is inserted through the through holes and coupled to the upper and lower end plates, and the fixing member and the through holes are configured to have a horizontal sectional structure to restrain rotation of the fixing member when rotational force for fastening is applied to the fixing member.

22 Claims, 8 Drawing Sheets

(51) Int. Cl.
  *B60L 11/18* (2006.01)
  *H01M 2/20* (2006.01)
  *H01M 2/22* (2006.01)
  *H01M 10/04* (2006.01)

(52) U.S. Cl.
  CPC ........ *G01R31/3606* (2013.01); *G01R 31/3696* (2013.01); *H01M 2/1077* (2013.01); *H01M 2/206* (2013.01); *H01M 2/22* (2013.01); *H01M 10/0413* (2013.01); *H01M 10/0463* (2013.01); *H01M 2220/20* (2013.01); *Y02T 10/7005* (2013.01); *Y02T 10/705* (2013.01); *Y02T 90/16* (2013.01)

(56) References Cited

U.S. PATENT DOCUMENTS

| | | | |
|---|---|---|---|
| 2005/0221177 A1* | 10/2005 | Amagai et al. | 429/186 |
| 2006/0177733 A1 | 8/2006 | Ha et al. | |
| 2007/0141457 A1 | 6/2007 | Amagai | |
| 2008/0118819 A1* | 5/2008 | Gamboa et al. | 429/61 |
| 2008/0138698 A1 | 6/2008 | Ogami et al. | |
| 2010/0047676 A1* | 2/2010 | Park et al. | 429/93 |
| 2010/0136420 A1* | 6/2010 | Shin et al. | 429/178 |
| 2010/0151299 A1* | 6/2010 | Ha et al. | 429/61 |

FOREIGN PATENT DOCUMENTS

| | | | | |
|---|---|---|---|---|
| JP | 2005-135743 A | 5/2005 | | |
| JP | 2006-172882 A | 6/2006 | | |
| JP | 2007-157633 A | 6/2007 | | |
| JP | 2007-172893 A | 7/2007 | | |
| JP | 2008-147045 A | 8/2008 | | |
| JP | 2009-146795 A | 7/2009 | | |
| JP | 2011-108408 A | 6/2011 | | |
| KR | 10-2006-0073387 A | 6/2006 | | |
| KR | 10-2008-0025429 A | 3/2008 | | |
| KR | 10-2008-0032287 A | 4/2008 | | |
| WO | WO 2006/043163 | * | 4/2006 | H01M 2/16 |
| WO | WO 2006/059420 A1 | 6/2006 | | |
| WO | WO 2006/059421 A1 | 6/2006 | | |

OTHER PUBLICATIONS

International Search Report issued in PCT/KR2011/005819, mailed on Apr. 4, 2012.

Chinese Office Action for Application No. 201180040007.0 dated Jun. 8, 2015 with English translation.

* cited by examiner

200

BATTERY MODULE AND BATTERY PACK EMPLOYED WITH THE SAME

CROSS REFERENCE TO RELATED APPLICATIONS

This application is a Continuation of PCT International Application No. PCT/KR2011/005819 filed on Aug. 10, 2011, which claims priority under 35 U.S.C. §119(a) to Patent Application No. 10-2010-0078624 filed in the Republic of Korea on Aug. 16, 2010, all of which are hereby expressly incorporated by reference into the present application.

TECHNICAL FIELD

The present invention relates to a battery module including a plurality of battery cells, and, more particularly, to a battery module having a plurality of battery cells, the battery module including a cell module stack having a structure in which a plurality of cell modules having the battery cells mounted in cartridges is vertically stacked, a lower end plate to support a lower end of the cell module stack, and an upper end plate to fix an uppermost cartridge of the cell module stack disposed on the lower end plate, wherein the cartridges, the upper end plate, and the lower end plate are provided with through holes formed such that the through holes communicate with one another, a fixing member is inserted through the through holes and coupled to the upper end plate and the lower end plate, and the fixing member and the through holes are configured to have a horizontal sectional structure to restrain rotation of the fixing member when rotational force for fastening is applied to the fixing member.

BACKGROUND ART

Recently, a secondary battery, which can be charged and discharged, has been widely used as an energy source for wireless mobile devices or as an auxiliary power unit. Also, the secondary battery has attracted considerable attention as a power source for electric vehicles (EV), hybrid electric vehicles (HEV), and plug-in hybrid electric vehicles (Plug-In HEV), which have been developed to solve problems, such as air pollution, caused by existing gasoline and diesel vehicles using fossil fuels.

Small-sized mobile devices use one or several battery cells for each device. On the other hand, middle or large-sized devices, such as vehicles, or an auxiliary power unit uses a middle or large-sized battery module having a plurality of battery cells electrically connected to one another because high power and large capacity are necessary for the middle or large-sized devices or the auxiliary power unit.

Preferably, the battery module is manufactured so as to have as small a size and weight as possible. For this reason, a prismatic battery or a pouch-shaped battery, which can be stacked with high integration and has a small weight to capacity ratio, is usually used as a battery cell (unit cell) of the middle or large-sized battery module. In particular, much interest is currently focused on the pouch-shaped battery, which uses an aluminum laminate sheet as a sheathing member, because the pouch-shaped battery is lightweight, the manufacturing costs of the pouch-shaped battery are low, and it is easy to modify the shape of the pouch-shaped battery.

Generally, a plurality of battery cells is stacked and fixed using long bolts to constitute a battery module. However, the thickness of portions of the battery module at which the long bolts are fastened is less than that of the other portions of the battery module with the result that it is difficult to maintain dimensional stability.

Also, dimensional stability of the battery module may not be maintained due to accumulated tolerance generated at welded portions between electrode tabs and bicells of each of the battery cells.

The battery module may be individually used. Alternatively, two or more battery modules may be combined to constitute a battery pack. In this case, if dimensional stability of the battery pack is not maintained, the battery modules are not fixed in the battery pack when strong external impact or vibration is applied to the battery pack with the result that durability or safety of the battery pack is lowered.

If dimensional stability of the battery pack is maintained, the battery pack may be configured based on dimensions such that the battery pack is protected from strong external impact or vibration, thereby improving durability or safety of the battery pack.

Consequently, there is a high necessity for a battery module having a novel assembly structure to solve the above problems.

DISCLOSURE

Technical Problem

Therefore, the present invention has been made to solve the above problems and other technical problems that have yet to be resolved.

It is an object of the present invention to provide a battery module wherein a cartridge configured in a specific shape and a fixing member communicating with the cartridge to fasten an upper end plate and a lower end plate are used to maintain dimensional stability.

Technical Solution

In accordance with one aspect of the present invention, the above and other objects can be accomplished by the provision of a battery module having a plurality of battery cells, the battery module including a cell module stack having a structure in which a plurality of cell modules having the battery cells mounted in cartridges is vertically stacked, a lower end plate to support a lower end of the cell module stack, and an upper end plate to fix an uppermost cartridge of the cell module stack disposed on the lower end plate, wherein the cartridges, the upper end plate, and the lower end plate are provided with through holes formed such that the through holes communicate with one another, a fixing member is inserted through the through holes and coupled to the upper end plate and the lower end plate, and the fixing member and the through holes are configured to have a horizontal sectional structure to restrain rotation of the fixing member when rotational force for fastening is applied to the fixing member.

In the above structure, at least some electrical connection portions of the battery cells in each cell module or between the cell modules are partially connected in series to each other. Electrode terminals of the battery cells are coupled to each other in a state in which the electrode terminals of the battery cells are arranged so as to be adjacent to each other, and a predetermined number of battery cells are covered by a cell cover, thereby manufacturing a plurality of cell modules. Some sequences of this manufacturing process may be changed. For example, a plurality of cell modules may be manufactured, and then electrical connection between the cell modules may be performed.

In the conventional battery module assembly method, as previously described, long bolts are inserted through external cases and cartridges at one side, and then nuts are fastened to the long bolts at the other side. As the nuts are excessively fastened, therefore, excessive force is applied to the battery module with the result that the battery module may be deformed.

In the battery module according to the present invention, on the other hand, the fixing member is inserted through the through holes with the result that the thickness of the battery module is maintained by the length of the fixing member, thereby achieving structural stability of the battery module.

Also, the fixing member is configured to have a horizontal sectional structure to restrain rotation of the fixing member when rotational force for fastening is applied to the fixing member. Consequently, the fixing member is prevented from being rotated, thereby achieving stable fastening.

In a preferred example, the fixing member may be provided at opposite ends thereof with fastening grooves or fastening protrusions.

It is advantageous for the fixing member to have a relatively small length for easy assembly. For this reason, the fixing member is preferably configured to have fastening structures, each of which is formed in the shape of a fastening groove.

Fastening members may be inserted into the fastening grooves of the fixing member such that the fixing member is coupled to the upper end plate and the lower end plate. The fastening members are not particularly restricted so long as the fastening members can be fastened into the fastening grooves. For example, the fastening members may be fastening screws or bolts. In a case in which fastening protrusions are formed at the opposite ends of the fixing member, nuts may be used as the fastening members.

As previously described, the fixing member is configured to have a horizontal sectional structure to restrain rotation of the fixing member when rotational force for fastening is applied to the fixing member. Preferably, the fixing member is configured to have a polygonal shape or a circular shape having a protrusion in horizontal section.

In this case, each of the through holes is preferably formed in an inner shape corresponding to an outer shape of the fixing member. If the inner shape of each of the through holes does not coincide with the outer shape of the fixing member, the fixing member may be rotated, or the outside of the fixing member and/or the inside of each of the through holes may be partially damaged, by rotational torque when rotational force is applied to the fixing member.

In a concrete example, the fixing member may be a cylindrical bar having a protrusion formed at an outer circumference thereof.

In a case in which the fixing member is provided at the opposite ends thereof with the fastening structures, fastening is generally achieved by rotational force. For this reason, the fixing member may be considered to have a circular shape in horizontal section. In a case in which the fixing member has a circular shape in horizontal section, however, the fixing member may be rotated by rotation force. Preferably, therefore, the fixing member is provided at the outer circumference thereof with a protrusion to restrain rotation of the fixing member.

The protrusion serves to sustain rotational torque generated by rotational force. Therefore, a large number of protrusions may effectively distribute rotational torque, thereby preventing damage to the fixing member. In a case in which the number of protrusions is too large, however, the length of each of the protrusions is shortened with the result that it is difficult to sustain rotation torque and to manufacture the fixing member. For this reason, it is preferable for the number of protrusions to be 1 to 4 and for the protrusions to be successively formed in the longitudinal direction of the fixing member.

The fixing member is preferably made of a metallic material.

The fixing member serves to maintain the thickness of the battery module by the length of the fixing member, and therefore, the fixing member must endure pressure applied by the fastening member. The material for the fixing member is not particularly restricted so long as the fixing member has strength sufficient to function as described above. In terms of strength, however, the fixing member is preferably made of a metallic material. More preferably, the fixing member is made of aluminum to reduce the weight of the battery module.

In the battery module according to the present invention, each of the upper and the lower end plates is preferably made of a metallic material. Also, each of the upper and the lower end plates is preferably provided at a central part thereof with an insulating material to prevent introduction of radiant heat into the battery cells.

In a preferred example, the battery module may further include a voltage detection assembly mounted at a side of the cell module stack from which electrodes protrude to detect voltages of the battery cells.

The battery module is configured by combining a plurality of battery cells. In a case in which overvoltage, overcurrent, or overheating occurs in some of the battery cells, therefore, safety and operational efficiency of the battery module are lowered. For this reason, it is necessary to provide a means to detect and control overvoltage, overcurrent, or overheating of the battery cells.

In this regard, the voltage detection assembly, which is a member to detect voltages of battery cells having electrode terminals formed at the upper end or the lower end thereof in a state in which the member is mounted to the battery module, may include (a) a block case, formed of an electrically insulative material, mounted to the front or rear of the battery module corresponding to electrode terminal connection parts of the battery cells, (b) conductive sensing parts connected to voltage detection terminals located at one-side ends of bus bars electrically connected to the electrode terminal connection parts of the battery cells, and (c) a connector to transmit voltages detected by the conductive sensing parts to a controller. The block case may include mounting grooves, opened to the front, formed at positions of the block case corresponding to the voltage detection terminals of the bus bars such that the conductive sensing parts are mounted in the mounting grooves, and the conductive sensing parts may be connected to the voltage detection terminals of the bus bars in a state in which the conductive sensing parts are mounted in the mounting grooves of the block case.

That is, the voltage detection assembly is configured to have a structure in which the conductive sensing parts are connected to the voltage detection terminals of the bus bars in a state in which the conductive sensing parts are mounted in the mounting grooves of the block case. Consequently, the assembly process of the voltage detection assembly is simplified, and the voltage detection assembly has a structure that is compact and is capable of stably detecting voltages.

Also, the members to detect voltages of the battery cells are configured to have a modular assembly structure, and therefore, the voltage detection assembly can be easily mounted to the front or rear of the battery module.

Furthermore, the assembly structure configured as an individual part can be provided by outside suppliers, thereby greatly improving productivity of the battery module. Also, when elements constituting the voltage detection assembly are abnormal, it is possible to replace only the voltage detection assembly mounted to the front or rear of the battery module without disassembly of the battery module, thereby greatly improving maintenance of the battery module, as compared with the conventional battery module structure.

In addition, the conductive sensing parts are fixed to the block case in a state in which the conductive sensing parts are arranged in the same line, and therefore, the voltage detection assembly according to the present invention may be easily extended according to use environments, voltage and current, of the battery module.

The controller may be, for example, a battery management system (BMS).

The mounting grooves of the block case may be individually formed for each conductive sensing part, and therefore, each of the conductive sensing parts may be inserted into a corresponding one of the mounting grooves. The mounting grooves prevent contact between the conductive sensing parts.

In a preferred example, each of the conductive sensing parts may be configured to have a receptacle type structure in which each of the conductive sensing parts is inserted into a corresponding one of the voltage detection terminals of the bus bars from the front of each of the conductive sensing parts. Even when external impact is applied, electrical connection between the conductive sensing parts and the voltage detection terminals is stably maintained.

Specifically, each of the conductive sensing parts includes a receptacle part inserted into a corresponding one of the voltage detection terminals of the bus bars and a conduction wire, and the receptacle part is connected to the conduction wire in a state in which the receptacle part is perpendicular to the conduction wire.

The structure of each of the conductive sensing parts is not particularly restricted so long as the conductive sensing parts are easily connected to the connector to transmit detected voltages to the controller. For example, the conductive sensing parts may be connected to the connector via wires, and each of the wires may be wrapped with insulative tape for insulation from the outside or may be mounted in a tubular pipe. The tubular pipe may be, for example, a hollow insulative pipe.

Each of the bus bars may include a plate-shaped body electrically connected to an electrode terminal connection part of each of the battery cells and a voltage detection terminal formed at one end of the plate-shaped body.

Also, each of the bus bars may protrude to the front, thereby easily achieving coupling between the bus bars and the block case.

In a preferred example, one of the bus bars, connected to a cathode or anode external input and output terminal, may further include a first external input and output terminal connection part formed at the other end of the plate-shaped body opposite to the voltage detection terminal and bent so as to protrude outward from the body.

In the above structure, a depression having a small vertical sectional area to cause a short circuit in an overcurrent state is formed between the body and the first external input and output terminal connection part. Consequently, the depression is cut when overcurrent is generated, thereby improving safety of the battery module.

In another preferred example, one of the bus bars, connected to an anode or cathode external input and output terminal, may further include a second external input and output terminal connection part formed at the other end of plate-shaped body opposite to the voltage detection terminal and bent so as to protrude outward and upward from the body.

In the first external input and output terminal connection part and the second external input and output terminal connection part may be formed fastening holes, in which the external input and output terminals are coupled.

In a preferred example, each of the cartridges may be configured to have a rectangular structure corresponding to each of the battery cells such that the battery cell can be mounted in the cartridge and may be provided at a central region thereof with an opening, through which heat is dissipated, through holes, through which fixing members to fix the cell module stack are inserted, may be formed in four corners of each of the cartridges, and a coupling part, to which an insulative mounting member to mount the voltage detection assembly and bus bars is fastened in an assembly fashion such that the voltage detection assembly is stably connected to the bus bars, may be formed at the front of each of the cartridges.

For example, the bus bars may be thermally welded to an injection molded material of the insulative mounting member.

The insulative mounting member may be configured to have a rectangular parallelepiped structure having a size corresponding to a front of the cell module stack, cartridge coupling grooves, into which front ends of the cartridges are inserted and coupled, may be formed at the rear of the insulative mounting member, and electrode terminal through holes, through which the electrode terminal connection parts of the battery cells are introduced from the rear of the insulative mounting member such that the electrode terminal connection parts of the battery cells are exposed, may be formed at opposite sides of the front of the insulative mounting member.

The insulative mounting member may be provided at opposite ends of the front thereof with location parts for external input and output terminals, in which the external input and output terminals of the bus bars are stably mounted, and the insulative mounting member may be provided at a central region thereof with a voltage detection assembly location part, in which the voltage detection assembly is stably mounted.

Fastening depressions are formed at the location parts for the external input and output terminal connection parts such that the external input and output terminal connection parts of the bus bars can be easily inserted into the fastening depressions.

Meanwhile, the electrode terminal connection parts of the battery cells exposed forward through the electrode terminal through holes may be electrically connected to the upper end surfaces of the bus bars mounted in the electrode terminal through holes.

Preferably, the block case is provided at opposite ends thereof with fastening protrusions protruding outward so as to be coupled into slits of the insulative mounting member, and sliding protrusions protruding outward so as to be fastened into the inside of a voltage detection assembly location part of the insulative mounting member in a sliding fashion are provided above the fastening protrusions.

Each of the cartridges is preferably configured to have a small thickness at parts of each of the cartridges corresponding to welded portions between electrode tabs and bicells of each of the battery cells.

The above structure offsets accumulated tolerance due to ultrasonic welding between tabs (or leads) and bicells of the battery cell, thereby achieving dimensional stability of the battery module.

In the battery module according to the present invention, the upper end plate may further include an external case fastening member.

In the battery module according to the present invention, each of the battery cells may be a pouch-shaped battery cell having an electrode assembly mounted in a case formed of a laminate sheet including a resin layer and a metal layer.

The laminate sheet may include a thermally welded inner resin layer, a blocking metal layer, and a durable external resin layer.

The battery module according to the present invention generally has a compact structure, and structurally stable mechanical fastening and electrical connection are achieved without using a large number of members. Also, a predetermined number, such as 4, 6, 8, or 10, of battery cells or cell modules may constitute a battery module, and therefore, it is possible to effectively mount a necessary number of battery modules in a limited space.

In accordance with another aspect of the present invention, there is provided a middle or large-sized battery pack of high power and capacity manufactured using the battery module as a unit module.

The middle or large-sized battery pack according to the present invention may be manufactured by combining battery modules based on desired power and capacity. In consideration of installation efficiency and structural stability as previously described, the middle or large-sized battery pack according to the present invention is preferably used as a power source for electric vehicles, hybrid electric vehicles, plug-in hybrid electric vehicles, or power storage devices.

Particularly in the battery pack having the above structure, battery cells are vertically stacked, and the total size of the battery pack is compact. Consequently, the battery pack may be mounted in a relay station of a telecommunication corporation such that the batter pack is used as an uninterruptible power supply that supplies power in an emergency.

DESCRIPTION OF DRAWINGS

The above and other objects, features and other advantages of the present invention will be more clearly understood from the following detailed description taken in conjunction with the accompanying drawings, in which.

BEST MODE

Now, preferred embodiments of the present invention will be described in detail with reference to the accompanying drawings. It should be noted, however, that the scope of the present invention is not limited by the illustrated embodiments.

Figure 1:
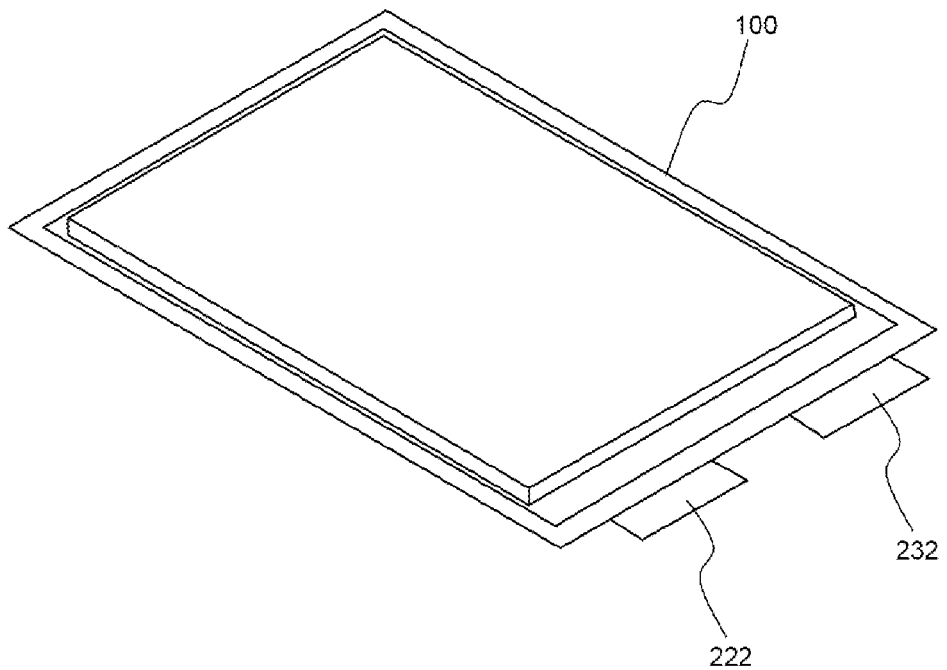
FIG. 1 is a perspective view showing a battery cell mounted in a battery module.
Figure 2:
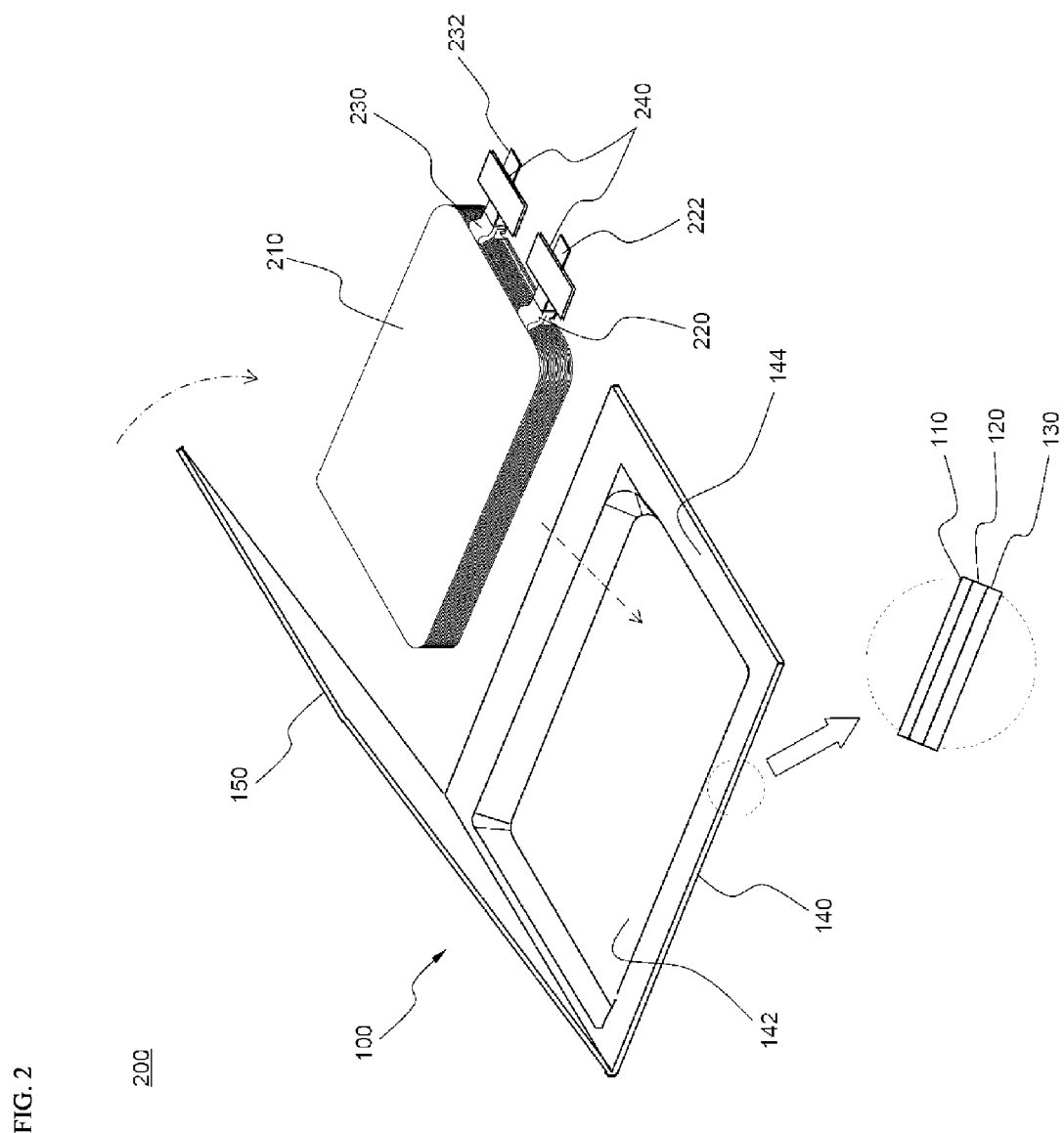
FIG. 2 is an exploded typical view of FIG. 1.

FIG. 1 is a perspective view typically showing an exemplary battery cell mounted in a unit module according to the present invention, and FIG. 2 is an exploded typical view of FIG. 1.

Referring to these drawings, a pouch-shaped battery cell 200 is configured to have a structure in which an electrode assembly 210, including cathodes, anodes, and separators disposed respectively between the cathodes and the anodes, is mounted in a pouch-shaped battery case 100 in a sealed state such that two electrode terminals 222 and 232 electrically connected to cathode and anode tabs 220 and 230 of the electrode assembly are exposed to the outside.

The battery case 100 includes a case body 140 having a depressed receiving part 142, in which the electrode assembly 210 is located, and a cover 150 integrally connected to the case body 140.

The cathode tabs 220 and the anode tabs 230 of the stacked type or stacked/folded type electrode assembly 210 are respectively coupled to the electrode terminals 222 and 232 by welding. Also, insulative films 240 are attached to the top and bottom of each of the electrode terminals 222 and 232 to prevent the occurrence of a short circuit between a thermal welding device and electrode terminals 222 and 232 and to achieve sealing between the electrode terminals 222 and 232 and the battery case 100 when a surplus part 144 of the case body 140 and the cover 150 are thermally welded to each other using the thermal welding device.

The battery case 140 and the cover 150 include outer resin layers 110, isolation metal layers 120, and inner resin layers 130. The inner resin layers 130 of the battery case 140 and the cover 150 may be tightly fixed to the each other by heat and pressure applied from the thermal welding device (not shown) to the outer surface of the battery case 140 and the outer surface the cover 150.

In a state in which the electrode assembly 210 impregnated with an electrolyte is placed in the receiving part 142, contact parts between the surplus part 144 of the case body 140 and the cover 150 are thermally welded to form sealed parts.

Figure 3:
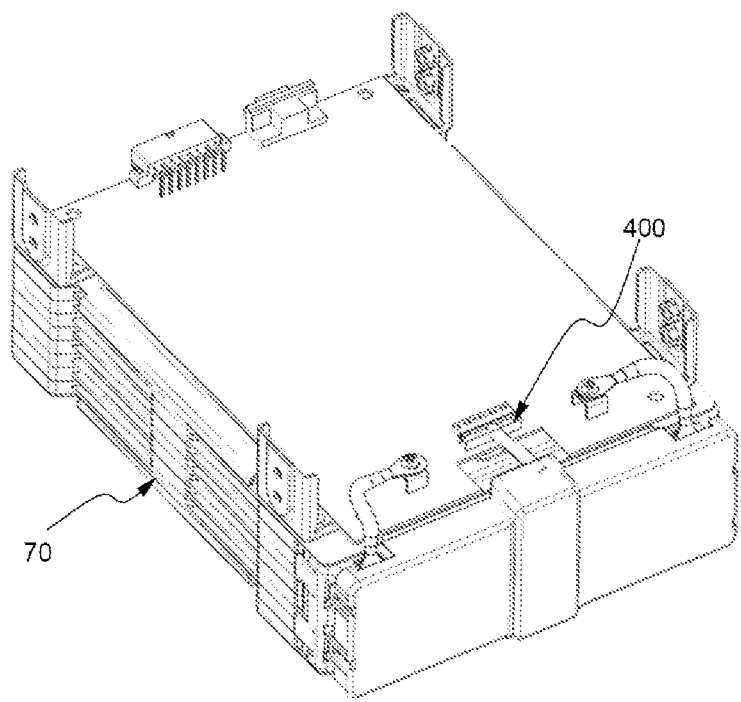
FIG. 3 is a perspective view showing a battery module according to an embodiment of the present invention.
Figure 4:
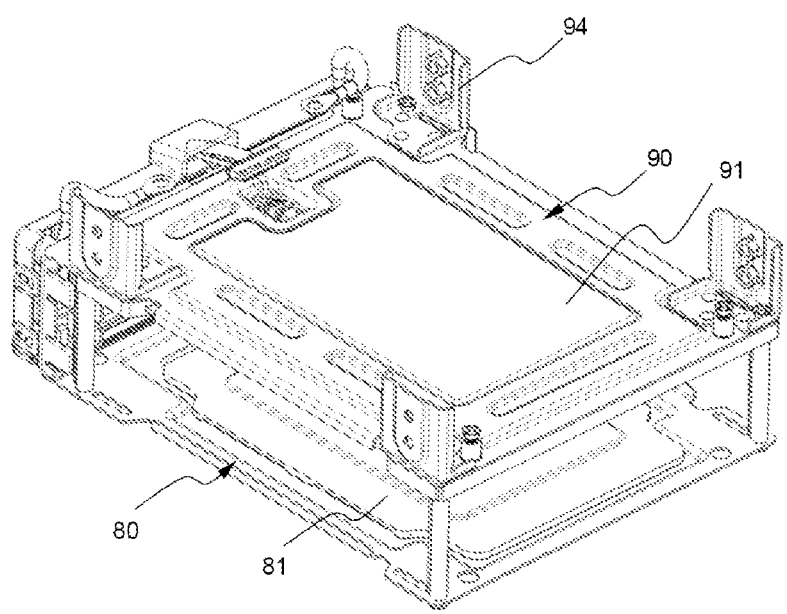
FIG. 4 is a perspective view showing the structure of the battery module of FIG. 3 excluding a cell module stack and a controller.
Figure 5:
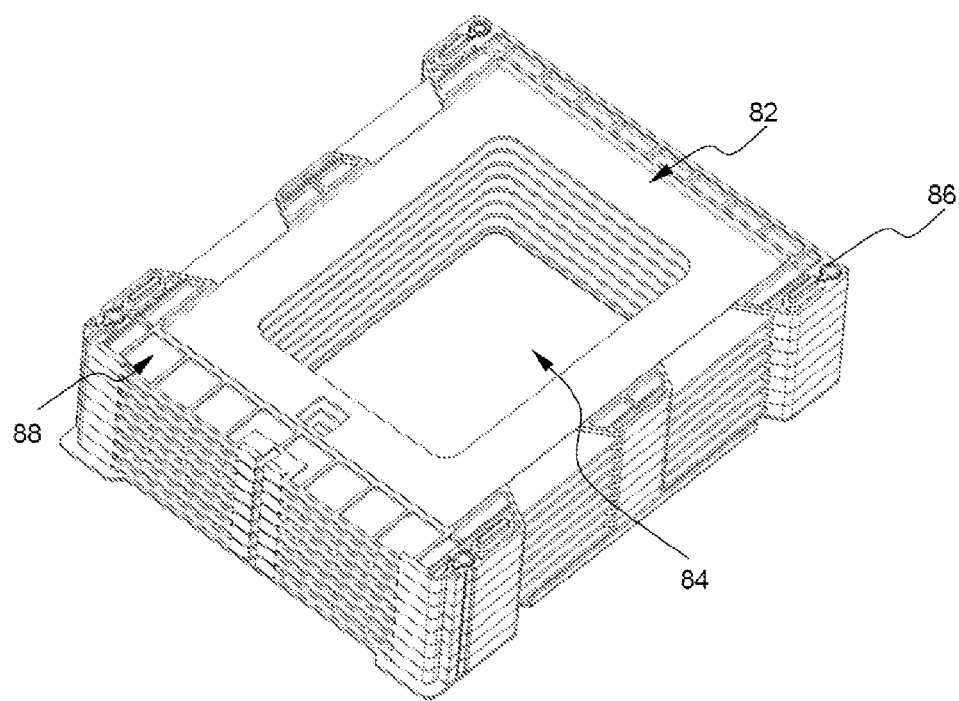
FIG. 5 is a perspective view showing a structure in which cartridges of the battery module of FIG. 3 are stacked.

FIG. 3 is a perspective view typically showing a battery module according to an embodiment of the present invention, and FIG. 4 is a perspective view typically showing the structure of the battery module of FIG. 3 excluding a cell module stack and a controller. Also, FIG. 5 is a perspective view typically showing a structure in which cartridges of the battery module of FIG. 3 are stacked.

Referring to these drawings together with the other drawings, a battery module 300 includes a voltage detection assembly 400, a cell module stack 70 having a structure in which a plurality of cell modules, each of which includes a battery cell mounted in a cartridge, is vertically stacked, a lower end plate 80 to support the lower end of the cell module stack 70, and an upper end plate 90 to fix an uppermost cartridge 82 of the cell module stack 70 disposed on the lower end plate 80. Also, a fastening member 94 configured to be fastened to an external case (not shown) is formed on the upper end plate 90.

At the central parts of the upper and lower end plates 90 and 80 are respectively mounted insulating materials 91 and 81 to prevent introduction of radiant heat into the battery cells.

Each of the cartridges 82 is configured to have a rectangular structure corresponding to a battery cell such that the battery cell can be mounted in the cartridge 82. Each of the cartridges 82 is provided at the central region thereof with an opening 84, through which heat is dissipated. Also, through holes 86, through which fixing members (not shown) to fix four corners of the cell module stack 70 are inserted, are formed in four corners of each of the cartridges 82. Through holes 86 are also formed in the upper and lower end plates 90 and 80. When the upper and lower end plates 90 and 80 and the cartridges 82 are stacked to assemble a battery module, therefore, the through holes communicate with one another.

At the front of each of the cartridges 82 is formed a coupling part 88, to which an insulative mounting member 50 to mount the voltage detection assembly 400 and bus bars 40a, 40b, and 40c is fastened in an assembly fashion. Consequently, the voltage detection assembly 400 is stably connected to voltage detection terminals 44 of the bus bars 40a, 40b, and 40c.

Also, the battery module 300 is configured to have a structure in which a battery cell is mounted in a cartridge 82 of each cell module, a plurality of cartridges 82 is stacked on the lower end plate 80, and the upper end plate 90 is coupled to the uppermost one of the cartridges 82.

Figure 6:
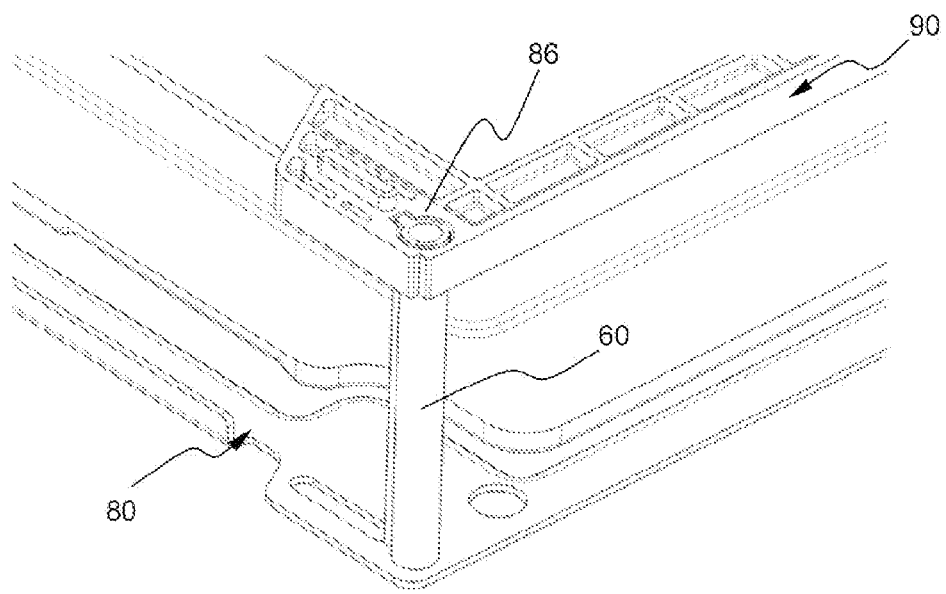
FIG. 6 is a perspective view showing a structure in which a fixing member according to an embodiment of the present invention is mounted to upper and lower end plates.

FIG. 6 is a perspective view typically showing a structure in which a fixing member according to an embodiment of the present invention mounted to upper and lower end plates.

Referring to FIG. 6, a fixing member 60, formed in the shape of a cylindrical bar having a protrusion formed at the outer circumference thereof, is inserted through the through holes 86 of the upper and lower end plates 90 and 80.

The fixing member 60 is also inserted through the through holes formed in the cartridges 82 of the cell module stack 70 mounted between the upper and lower end plates 90 and 80.

The fixing member 60, configured to have a cylindrical structure having a protrusion formed at the outer circumference thereof as shown in the drawing, is provided at opposite ends thereof with fastening grooves (not shown) having screw threads, into which fastening members (not shown), such as fastening screws or bolts, are engaged outside the upper and lower end plates 90 and 80, thereby achieving coupling therebetween.

Figure 7:
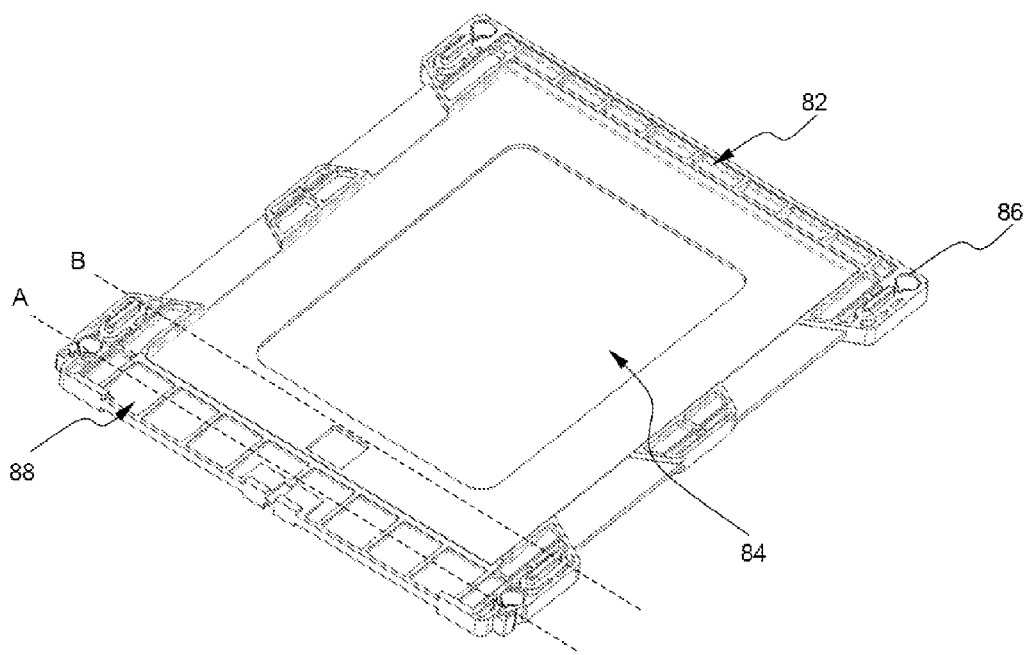
FIG. 7 is a perspective view showing a cartridge according to an embodiment of the present invention.

FIG. 7 is a perspective view typically showing a cartridge according to an embodiment of the present invention.

Referring to this drawing, the thickness of the cartridge 82 in section "A" is less than that of the cartridge 82 in section "B". At a portion of a battery cell located in section "A", accumulated tolerance due to ultrasonic welding between bicells and tabs (leads) of the battery cell occurs. To offset such accumulated tolerance, therefore, the cartridge 82 is configured such that the thickness of the cartridge 82 in section "A" is less than that of the cartridge 82 in section "B", thereby achieving dimensional stability of the battery module.

Figure 8:
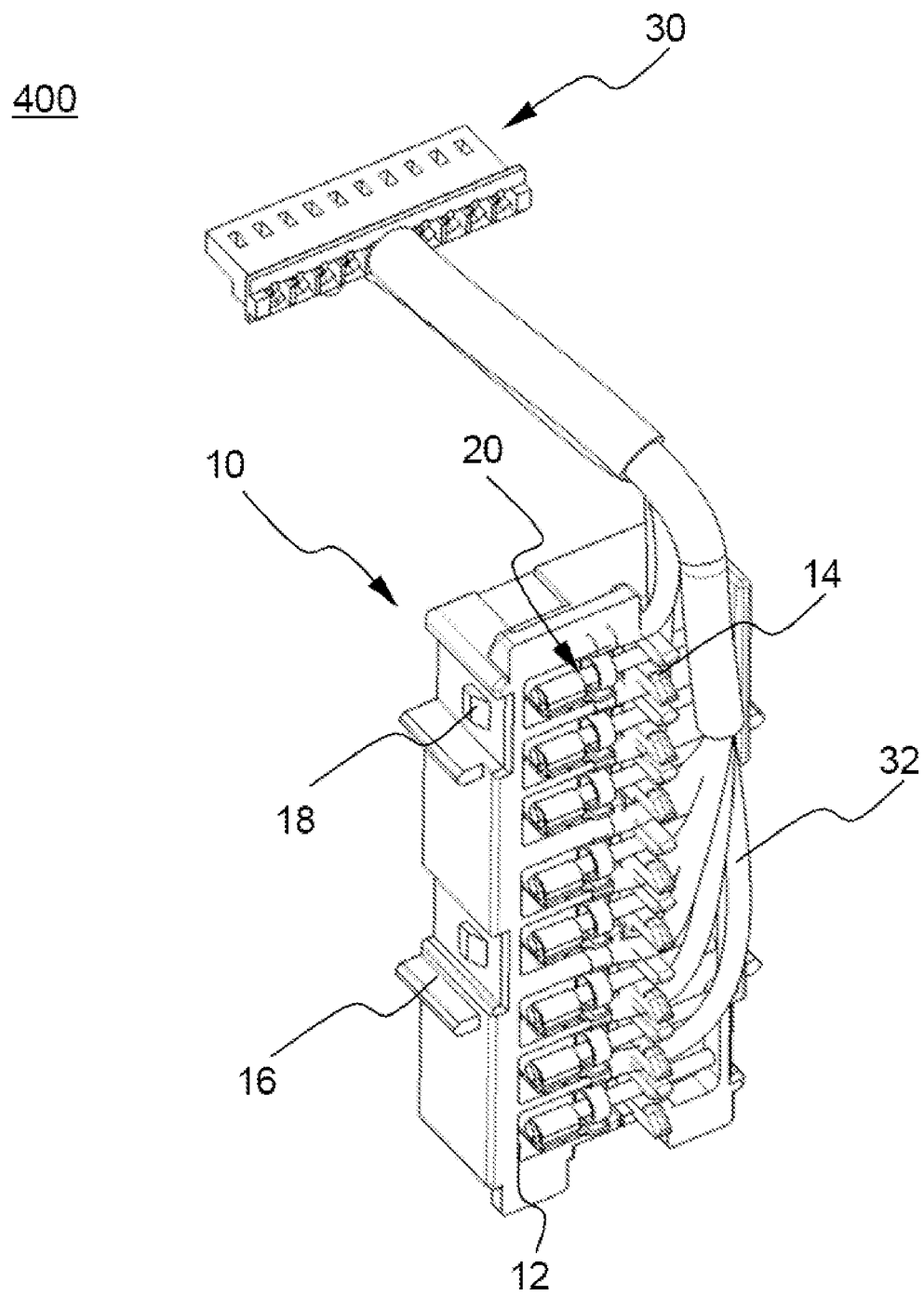
FIG. 8 is a perspective view showing a voltage detection assembly according to an embodiment of the present invention.
Figure 9:
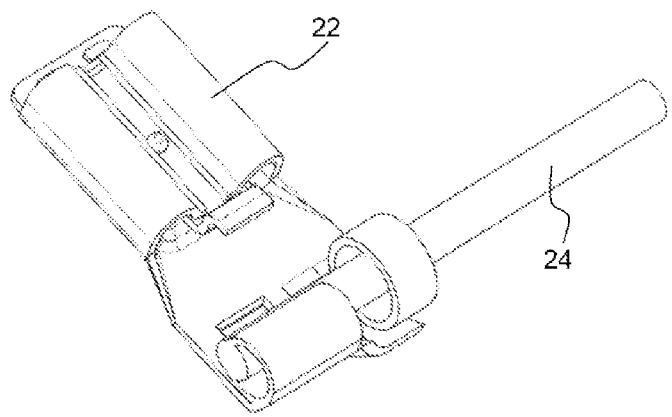
FIG. 9 is a perspective view showing a conductive sensing part of FIG. 8.

FIG. 8 is a perspective view typically showing a voltage detection assembly according to an embodiment of the present invention, and FIG. 9 is a perspective view typically showing a conductive sensing part of FIG. 8.

Figure 11:
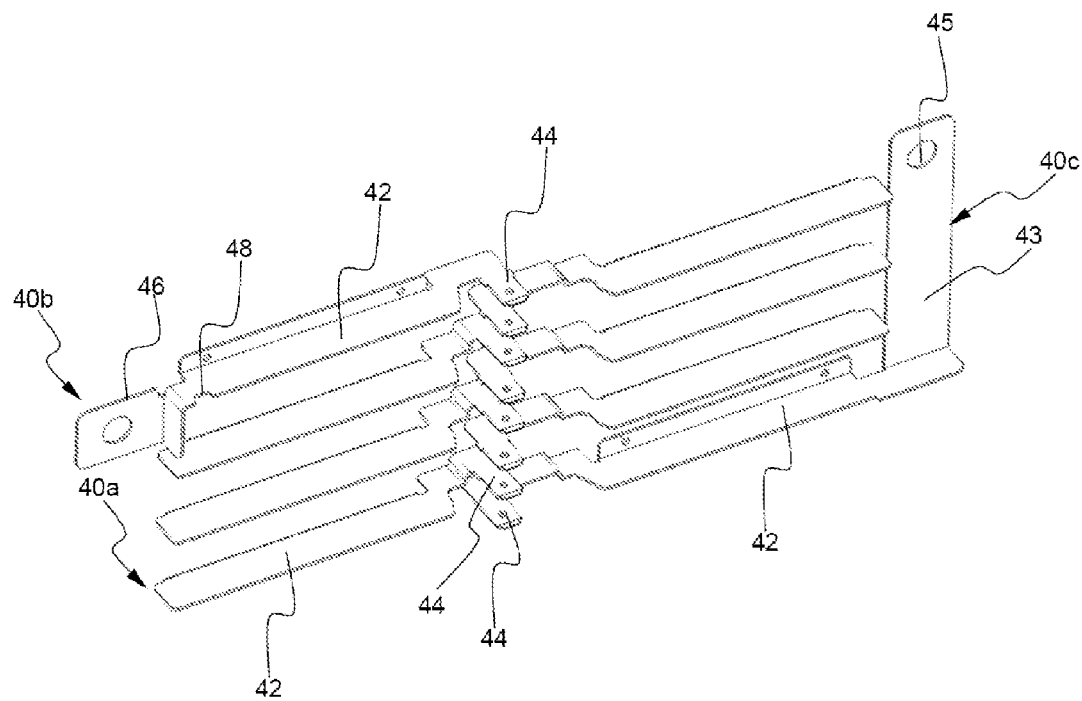
FIG. 11 is a perspective view showing bus bars mounted to the insulative mounting member of FIG. 10.

Referring to these drawings together with FIGS. 3 and 11, the voltage detection assembly 400 includes a block case 10 mounted to the front of the battery module 300 corresponding to electrode terminal connection parts of the battery cells, conductive sensing parts 20 connected to the voltage detection terminals 44 located at one-side ends of the bus bars 40a electrically connected to the electrode terminal connection parts (not shown) of the battery cells, and a connector 30 to transmit voltages detected by the conductive sensing parts 20 to the controller.

The block case 10 includes mounting grooves 12, opened to the front, formed at positions of the block case 10 corresponding to the voltage detection terminals 44 of the bus bars 40a such that the conductive sensing parts 20 are mounted in the mounting grooves 12. The conductive sensing parts 20 are connected to the voltage detection terminals 44 of the bus bars 40a in a state in which the conductive sensing parts 20 are mounted in the mounting grooves 12 of the block case 10.

Also, the mounting grooves 12 of the block case 10 are individually formed for each conductive sensing part 20. Each of the conductive sensing parts 20 is configured to have a receptacle type structure in which each of the conductive sensing parts 20 is inserted into a corresponding one of the voltage detection terminals 44 of the bus bars 40a from the front of each of the conductive sensing parts 20.

Specifically, each of the conductive sensing parts 20 includes a receptacle part 22 inserted into a corresponding one of the voltage detection terminals 44 of the bus bars 40a and a conduction wire 24. The receptacle part 22 is connected to the conduction wire 24 in a state in which the receptacle part 22 is perpendicular to the conduction wire 24.

The conductive sensing parts 20 are connected to the connector via their wires 24. The wires 24 are wrapped with insulation tapes 32 to insulate the wires 24 from the outside.

Also, clamp-shaped fastening members 14 to stably fix the wires 24 protrude forward from the front of the block case 10.

The block case 10 is provided at opposite ends thereof with fastening protrusions 16, which protrude outward so as to be coupled into slits of the insulative mounting member 50. Above the fastening protrusions 16 are provided sliding protrusions 18, which protrude outward so as to be fastened into the inside of a voltage detection assembly location part 54 of the insulative mounting member 50 in a sliding fashion.

Figure 10:
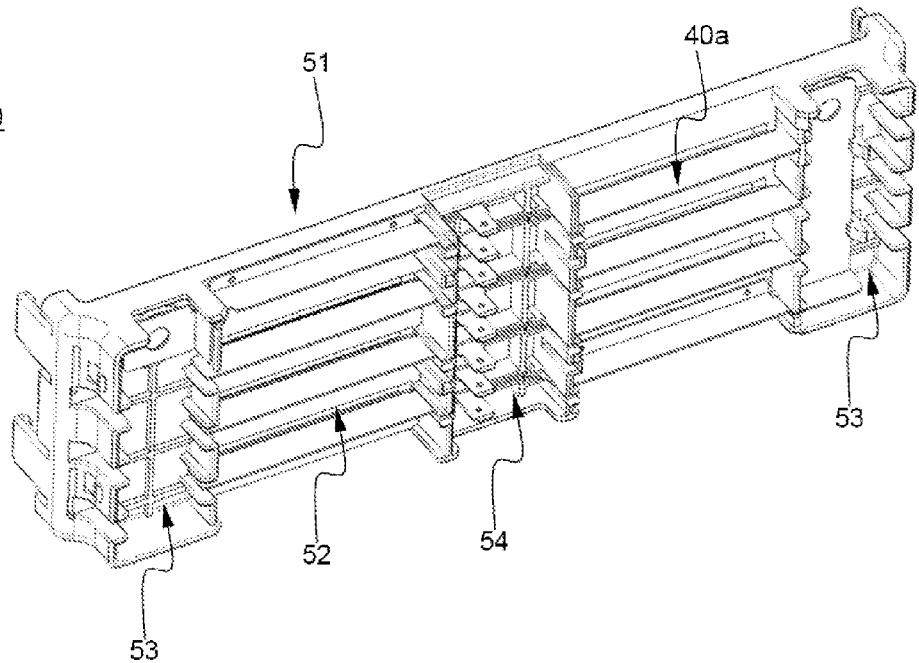
FIG. 10 is a perspective view showing an insulative mounting member in which the voltage detection assembly of FIG. 8 is mounted.

FIG. 10 is a perspective view typically showing the insulative mounting member in which the voltage detection assembly of FIG. 8 is mounted, and FIG. 11 is a perspective view typically showing the bus bars mounted to the insulative mounting member of FIG. 10.

Referring to these drawings together with FIG. 3, each of the bus bars 40a includes a plate-shaped body 42 electrically connected to an electrode terminal connection part of a battery cell and a voltage detection terminal 44 formed at one end of the plate-shaped body 42.

Of the bus bars, the bus bar 40b connected to a cathode external input and output terminal further includes a first external input and output terminal connection part 46 formed at the other end of the plate-shaped body 42 opposite to the voltage detection terminal 44 and bent so as to protrude outward from the body 42.

Between the body 42 and the first external input and output terminal connection part 46 is formed a narrow depression 48 having a vertical sectional area equivalent to 40% that of the body 42 to cause a short circuit in an overcurrent state.

Of the bus bars, the bus bar 40c connected to an anode external input and output terminal further includes a second external input and output terminal connection part 43 formed at the other end of the plate-shaped body 42 opposite to the voltage detection terminal 44 and bent so as to protrude outward and upward from the body 42.

In the first external input and output terminal connection part 46 and the second external input and output terminal connection part 43 are formed fastening holes 45, into which the external input and output terminals are coupled.

The insulative mounting member 50 is configured to have a rectangular parallelepiped structure having the size corresponding to the front of the cell module stack 70. At the rear of the insulative mounting member 50 are formed cartridge coupling grooves 51 into which the front ends of the cartridges are inserted and coupled. At opposite sides of the front of the insulative mounting member 50 are formed electrode terminal through holes 52, through which the electrode terminal connection parts of the battery cells are introduced from the rear of the insulative mounting member 50 such that the electrode terminal connection parts of the battery cells are exposed.

Also, location parts 53 for the external input and output terminal connection parts are formed at opposite ends of the front of the insulative mounting member 50 such that the external input and output terminal connection parts 46 and 43 of the bus bars 40a, 40b, and 40c are stably mounted in the location parts 53. In addition, the voltage detection assembly location part 54 is formed at the central region of the insulative mounting member 50 such that the voltage detection assembly 400 is stably mounted in the voltage detection assembly location part 54.

Fastening depressions are formed at the location parts 53 for the external input and output terminal connection parts, and the electrode terminal connection parts (not shown) of the battery cells exposed forward through the electrode terminal through holes 52 are electrically connected to the upper end surfaces of the bus bars 40a mounted in the electrode terminal through holes 52.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, in the battery module according to the present invention, dimension decrease due to fastening or accumulated tolerance between the electrode tabs and the cells due to charge and discharge is offset, and therefore, dimensional stability of the battery module is improved.

Also, even when strong external impact or vibration is applied to the battery module, movement of the battery module in an external case is minimized by virtue of the improved dimensional stability of the battery module, thereby contributing to durability and safety.

The invention claimed is:

1. A battery module having a plurality of battery cells, the battery module comprising:
    a cell module stack having a structure in which a plurality of cell modules having the battery cells mounted in cartridges is vertically stacked;
    a lower end plate to support a lower end of the cell module stack;
    an upper end plate to fix an uppermost cartridge of the cell module stack disposed on the lower end plate;
    through holes provided in the cartridges, the upper end plate, and the lower end plate formed such that the through holes communicate with one another;
    a fixing member inserted through the through holes and coupled to the upper end plate and the lower end plate; and
    a voltage detection assembly mounted at a side of the cell module stack to detect voltages of the battery cells, wherein the voltage detection assembly comprises:
    (a) a block case, formed of an electrically insulative material, mounted to a front or rear of the battery module corresponding to electrode terminal connection parts of the battery cells;
    (b) conductive sensing parts connected to voltage detection terminals located at one-side ends of bus bars electrically connected to the electrode terminal connection parts of the battery cells; and
    (c) a connector to transmit voltages detected by the conductive sensing parts to a controller,
    wherein the fixing member is configured to have an outer shape of a polygonal shape or a circular shape having a protrusion in horizontal section,
    wherein each of the through holes is formed in an inner shape corresponding to the outer shape of the fixing member,
    wherein the block case comprises mounting grooves, opened to a front of the battery module, formed at positions of the block case corresponding to the voltage detection terminals of the bus bars such that the conductive sensing parts are mounted in the mounting grooves, and
    wherein the conductive sensing parts are connected to the voltage detection terminals of the bus bars in a state in which the conductive sensing parts are mounted in the mounting grooves of the block case.

2. The battery module according to claim 1, wherein the fixing member is provided at opposite ends thereof with fastening grooves.

3. The battery module according to claim 2, wherein fastening members are inserted into the fastening grooves of the fixing member such that the fixing member is coupled to the upper end plate and the lower end plate.

4. The battery module according to claim 3, wherein the fastening members are fastening screws or bolts.

5. The battery module according to claim 1, wherein the fixing member is a cylindrical bar having a protrusion formed at an outer circumference thereof.

6. The battery module according to claim 1, wherein the fixing member is made of a metallic material.

7. The battery module according to claim 1, wherein each of the upper and the lower end plates is made of a metallic material.

8. The battery module according to claim 1, wherein each of the upper and the lower end plates is provided at a central part thereof with an insulating material to prevent introduction of radiant heat into the battery cells.

9. The battery module according to claim 1, wherein each of the conductive sensing parts is configured to have a receptacle type structure in which each of the conductive sensing parts is inserted into a corresponding one of the voltage detection terminals of the bus bars from a front of each of the conductive sensing parts.

10. The battery module according to claim 9, wherein each of the conductive sensing parts comprises a receptacle part inserted into a corresponding one of the voltage detection terminals of the bus bars and a conduction wire, and the receptacle part is connected to the conduction wire in a state in which the receptacle part is perpendicular to the conduction wire.

11. The battery module according to claim 1,
    wherein each of the bus bars comprises a plate-shaped body electrically connected to one of the electrode terminal connection parts of one of the battery cells, and the voltage detection terminal formed at one end of the plate-shaped body.

12. The battery module according to claim 11, wherein one of the bus bars, connected to a cathode or anode external input and output terminal, further comprises a first external input and output terminal connection part formed at a second end of the plate-shaped body opposite to the voltage detection terminal and bent so as to protrude outward from the body.

13. The battery module according to claim 11, wherein one of the bus bars, connected to an anode or cathode external input and output terminal, further comprises a second external input and output terminal connection part formed at a second end of plate-shaped body opposite to the voltage detection terminal and bent so as to protrude outward and upward from the body.

14. The battery module according to claim 1, wherein each cartridge is configured to have a rectangular structure corresponding to each battery cells such that each battery cell can be mounted in a respective cartridge, wherein each cartridge is provided at a central region thereof with an opening, through which heat is dissipated,
wherein the through holes are formed in four corners of each of the cartridges, and
wherein a coupling part, to which an insulative mounting member to mount the voltage detection assembly and bus bars is fastened in an assembly fashion such that the voltage detection assembly is stably connected to the bus bars, is formed at a front of each of the cartridges.

15. The battery module according to claim 14, wherein the insulative mounting member is configured to include:
a rectangular parallelepiped structure having a size corresponding to a front of the cell module stack,
cartridge coupling grooves, into which front ends of the cartridges are inserted and coupled, formed at a rear of the insulative mounting member, and
electrode terminal through holes, through which electrode terminal connection parts of the battery cells are introduced from the rear of the insulative mounting member such that the electrode terminal connection parts of the battery cells are exposed, formed at opposite sides of a front of the insulative mounting member.

16. The battery module according to claim 15, wherein the insulative mounting member is provided at opposite ends of the front thereof with location parts for external input and output terminals, in which the external input and output terminals are stably mounted, and
wherein the insulative mounting member is provided at a central region thereof with a voltage detection assembly location part, in which the voltage detection assembly is stably mounted.

17. The battery module according to claim 1, wherein the battery cells are mounted in the cartridges of the cell modules, the cartridges are stacked on the lower end plate, and the upper end plate is coupled to an uppermost one of the cartridges.

18. The battery module according to claim 1, wherein the block case is provided at opposite ends thereof with fastening protrusions protruding outward so as to be coupled into slits of the insulative mounting member, and sliding protrusions protruding outward so as to be fastened into an inside of a voltage detection assembly location part of the insulative mounting member in a sliding fashion are provided above the fastening protrusions.

19. The battery module according to claim 1, wherein the upper end plate further comprises an external case fastening member.

20. The battery module according to claim 1, wherein each of the battery cells is a pouch-shaped battery cell having an electrode assembly mounted in a case formed of a laminate sheet comprising a resin layer and a metal layer.

21. A battery pack comprising two or more battery modules according to claim 1 based on power and capacity.

22. The battery pack according to claim 21, wherein the battery pack is used as a power source for electric vehicles, hybrid electric vehicles, plug-in hybrid electric vehicles, or power storage devices.

* * * * *